United States Patent
Zarnowski et al.

(10) Patent No.: US 7,129,461 B2
(45) Date of Patent: Oct. 31, 2006

(54) SCANNING IMAGER EMPLOYING MULTIPLE CHIPS WITH STAGGERED PIXELS

(75) Inventors: Jeffrey J. Zarnowski, McGraw, NY (US); Ketan V. Karia, Cortland, NY (US); Michael Joyner, Cortland, NY (US); Thomas Poonnen, Cortland, NY (US)

(73) Assignee: Panavision Imaging LLC, Homer, NY (US)

( * ) Notice: Subject to any disclaimer, the term of this patent is extended or adjusted under 35 U.S.C. 154(b) by 0 days.

(21) Appl. No.: 11/434,666

(22) Filed: May 16, 2006

(65) Prior Publication Data

US 2006/0202107 A1    Sep. 14, 2006

Related U.S. Application Data

(60) Division of application No. 11/356,199, filed on Feb. 17, 2006, which is a division of application No. 11/111,334, filed on Apr. 21, 2005, now Pat. No. 7,045,758, which is a continuation-in-part of application No. 10/141,008, filed on May 7, 2002, now Pat. No. 6,911,639.

(60) Provisional application No. 60/289,076, filed on May 7, 2001.

(51) Int. Cl.
*H01L 27/00* (2006.01)
*H04N 3/14* (2006.01)

(52) U.S. Cl. ............... 250/208.1; 250/214 A; 348/275; 348/300; 257/292

(58) Field of Classification Search ............ 250/208.1, 250/214 A; 348/275, 300–301, 308; 257/291–292
See application file for complete search history.

(56) References Cited

U.S. PATENT DOCUMENTS 6,084,229 A * 7/2000 Pace et al. ............... 250/208.1
6,166,831 A * 12/2000 Boyd et al. .................. 358/483
7,057,150 B1 * 6/2006 Zarnowski et al. ..... 250/214 R

* cited by examiner

*Primary Examiner*—Kevin Pyo
(74) *Attorney, Agent, or Firm*—Bernhard P. Molldrem, Jr.

(57) ABSTRACT

A solid state imaging system has at least one CMOS imager with first and second series of pixels in which the pixels of one series are offset, i.e., staggered, in respect to the pixels of the other series. Multiple imagers can be arrayed end to end, with jumper wires connecting the pixel output conductors or each so that the pixels feed into a common output amplifier for each series, to minimize chip to chip offset voltages. The pixels may be diagonally offset from one another, and a color imager can be constructed in which color ribbon filters are arranged diagonally across the imaging area. This arrangement minimizes color cross talk.

7 Claims, 8 Drawing Sheets

SCANNING IMAGER EMPLOYING MULTIPLE CHIPS WITH STAGGERED PIXELS

CONTINUING APPLICATION DATA

This is a division of copending Ser. No. 11,356,199, Feb. 17, 2006, which is a division of Ser. No. 11/111,334, Apr. 21, 2005, now U.S. Pat. No. 7,045,758, May 16, 2006, which is a continuation in part of earlier patent application Ser. No. 10,141,008, May 7, 2002, now U.S. Pat. No. 6,911,639, which claims priority of U.S. Provisional Application No. 60/289,076, May 7, 2001, now abandoned. The foregoing are incorporated herein by reference.

BACKGROUND OF THE INVENTION

This invention concerns solid state imagers and image capture systems, and in particular is directed to an improved configuration of the pixels into offset or staggered arrangements of two or more series of pixels. The invention is more particularly concerned with a configuration that employs two or more imager chips butted end-to-end, and which avoids undesirable gain variations from chip to chip. The invention is desirably carried out using low-power CMOS imager technology and offset series of pixels.

Solid state image sensors are used in a wide variety of applications, and there has been much interest in pursuing low-cost, high-resolution, high-reliability image sensors for such applications. CMOS imager technology is advantageous because of the requirement for a only a single power supply voltage, its ruggedness, and its inherent low power consumption. There has been great interest in achieving extremely high resolution also, which requires increased pixel density.

Scanning systems are used for a variety of image capture applications, such as web inspection and document copying and archiving. Conventionally, scanners of this type have utilized either Contact image Sensor (CIS) modules or CCDs to capture the image information. In such scanning systems, CCD imagers are limited in size to only a fraction of the width of the object being scanned, such as a photograph or text. This size limitation arises because of charge transfer difficulties over large distances, i.e., over distances comparable to the width of a page. This requires focusing the image of the document to reduce it down to the size of the imager. While it might be desirable to join a number of CCD imagers end to end to create in effect a single long image capture device, there are many drawbacks that make that impractical.

FIG. 1 illustrates a prior-art scanner arrangement or scanning system 10 which employs a CCD solid state imager 12. A focusing lens system 14 is positioned to focus onto the CCD imager 12 a reduced image of the object, e.g., a sheet of text 16, which is to be scanned. Mirrors (not shown here) may be employed in many practical scanner arrangements. An output buffer 18 is coupled to the CCD imager 12 and is employed via a flexible cable to drive an application-specific integrated circuit (ASIC) 22. An input buffer 20 is also coupled to the CCD imager 12 and is used to interface the captured image data, digitized by an analog-to-digital converter (A/D), to the host computer, networks, or other peripheral devices such as printers or modems, or in some cases all or some portion of a Multi-Function Peripheral (MFP) with image processing functions, motor control, light control, sheet feeder, and user interface ASIC device (s). A desktop system also contains a motor and a light source to move the imager underneath the document 16 to be scanned. Various different light sources such as fluorescent tubes and LEDs, and various different drive motors, such as stepping motors and synchronous motors can be employed. These are well known and not shown here, but would be understood to be included in the scanner system. The CCD imagers have many drawbacks and limitations, such as speed limitations, which arise due to charge transfer efficiency limitations, as well as a high power consumption, and a severely limited capability for integration of other functions onto the pixel array. In addition, in CCD imagers the pixels must be read out in a fixed sequence, which does not permit pixel information to be skipped.

A conventional CIS-based scanning system 30 is illustrated in FIG. 2. In this system, there are a plurality of CIS modules 32(1) to 32(N) joined end to end. The CIS modules 32(1)–32(N) are located in tight proximity to each other to construct a long contiguous array of sensors as wide as the image being captured. An optical coupler 34 is positioned to face the object 36 to be scanned and to focus an image of it onto the array of CIS modules. Because the array of modules 32(1)–32(N) need to be as wide as the object 36 to be scanned, the array has to be quite large. Accurate placement of the CIS modules 32(1)–32(N), which is necessary to pick up the entire image without gaps or jumps across the width of the object, makes the construction of the CIS-based system rather expensive. Also, the various individual CIS sensors each have individual voltage offsets that have to be corrected, and this also adds to the complexity of the system.

An active column sensor (ACS) architecture has recently been developed, as disclosed in Pace et al. U.S. Pat. No. 6,084,229, which permits a CMOS image sensor to be constructed as a single-chip video camera with a performance equal to or better than that which may be achieved by CCD or CID imagers. ACS imagers enjoy very low fixed pattern noise. The principles as disclosed and illustrated in the Pace et al. patent can be advantageously incorporated into imagers employed in scanning applications, and that patent is incorporated herein by reference.

OBJECTS AND SUMMARY OF THE INVENTION

Accordingly, it is an object of the present invention to provide a solid-state imager that can be employed in a scanning system and that avoids the drawbacks of the prior art.

It is another object to provide an imager that is economical and effective over a width sufficient for scanning a text document.

It is another object to improve the effective resolution of a monochrome or color imager.

In accordance with one aspect of the present invention, a solid-state area or linear imager integrated circuit is made as an array of pixel elements which are configured in two or more series of pixels. The pixels of one series are offset from one another, i.e., the pixel positions overlap or are staggered. The series of pixels are read out into respective output buses, and the outputs may be multiplexed horizontally or vertically. Two or more of these imager ICs can be butted end-to-end to create a wide imager assembly. In such case the output buses on each IC are also connected so in a fashion that minimizes any chip to chip voltage offset.

A system for capturing an image in accordance with an embodiment of the present invention employs a CMOS imaging system, an image focusing device, and an image control processing system coupled to the CMOS imaging system. The CMOS imaging system has at least one CMOS imager with at least one series of pixels. The image focusing device directs the image on to at least a portion of the at least one series of pixels.

A method for scanning or capturing an image in accordance with another embodiment of the present invention includes directing the image on to at least a portion of at least one series of pixels in a CMOS imaging system. Next, the image is captured with the at least one series of pixels in a CMOS imager in the CMOS imaging system. The CMOS imaging system is controlled during the capturing and processing of the image.

A system for capturing an image in accordance with another embodiment of the invention includes a first series of pixels in at least one CMOS imager and at least one more series of pixels that are at least adjacent to the first series of pixels in the at least one CMOS imager. The at least one additional series of pixels is offset from the first series of pixels.

A method for capturing an image in accordance with another embodiment of the invention includes offsetting a first series of pixels in at least one CMOS imager from at least one other series of pixels that are at least adjacent to the first series of pixels in the at least one CMOS imager and capturing the image with at least a portion of the offset first series of pixels and the at least one more series of pixels, to enhance the resolution of the captured image.

When multiple series of pixels are stacked such that the pixels are continuously offset, the pixels are arrayed to be aligned along diagonal axis or axes. A series of offset pixels can be read such that the video signal is binned on a common sense node, and color filters can be placed on the diagonal formed by the pixel underneath, thus allowing multiple advantages over prior art. Diagonally oriented pixels and color filters allow for improved color purity by minimizing color crosstalk.

The present invention may provide for a system for capturing an image with greater flexibility and lower cost than prior system for capturing images, such as those that rely upon CCD imagers or CIS imagers. The present invention includes a shutter to allow all pixels in a series, such as a row or column (or a diagonal), to share the same exposure period, independent integration periods for each color to enhance color balance, pixel skipping for multi-resolution imaging, staggered pixels to provide higher resolution and higher color purity in a smaller area, and binning of signals from pixels in different series. The recent advances of useful computing power of hand held and battery operated devices allow the addition of highly integrated, low power, small size, systems for the acquisition of images that can be pictures, text, video, bar codes, biometrics and as a result, puts multi-chip, power-hungry CCD based systems at a great disadvantage.

According to a preferred embodiment, a CMOS imaging system is arranged as an array of pixels in rows and columns on an imaging area, with the columns being divided into first and second series of columns alternating with one another such that the pixels of the columns of each series are offset by a predetermined amount from the pixels of the columns of the other series. Each column includes a column amplifier FET having a source electrode and a drain electrode. At least one pair of conductors associated with the first series of columns is coupled respectively with the source and drain electrodes of the column amplifier FETs of the first series of columns. Another pair of conductors associated with the second series of columns is coupled to the source and drain electrodes of the column amplifier FETs of the second series of columns. First and second output amplifiers each include an additional FET and a feedback path coupled to the respective pair of conductors of the respective series of columns. There is image control circuitry coupled to the pixels of said imager to control timing and gating of the respective pixels. In a preferred arrangement, corresponding pixels of the first and second series of columns are diagonally offset from one another. The pixels are arranged in pairs of pixel regions disposed diagonally on two sides of a pixel control region such that the pairs of pixel regions each extend diagonally. These define diagonal zones between successive pairs of pixel regions of that series. The pixels of the other series of columns of pixels are situated within said diagonal zones.

According to another preferred embodiment, a system for scanning an image may be formed out of a plurality of CMOS imagers, e.g., CMOS ICs, arranged end to end. Each such CMOS imager is configured with two series of pixels situated alongside one another and wherein one of the series of pixels is offset from the other of the series of pixels. Each imager also has two pairs of conductors extending along the series of pixels, with the pairs of conductors being associated with the respective series of pixels on said CMOS imager. Each pixel includes a respective pixel amplifier FET having a source electrode and a drain electrode which are respectively coupled to the conductors of the associated pair of conductors. Jumper conductors connect the conductors of each said pair of conductors of each said CMOS imager with the corresponding conductors of the remaining imager or imagers. A pair of output amplifiers each including an additional FET and a feedback path coupled to a respective pair of conductors of at least one of said CMOS imagers. Image control circuitry coupled to the series of pixels of said imagers act to control the timing and gating of the pixels. Associated image focusing means, i.e., a lens group or mirror or combination of such focusing elements, forms an optical image onto this wide assembly of imagers. The outputs of the offset series of pixels can be used together or separately, so as to permit scan speed and resolution to be selected as needed, and to permit other effects such as pixel binning, which can be employed for low light applications. The arrangement as disclosed configures the entire battery of imager ICs as a single active column sensor or ACS, with the output amplifiers serving each pixel of the respective series of all the conjoined imagers. This removes image distortion due to voltage offsets, as the pixel output amplifiers each form a part of the respective output amplifier.

According to any of a number of embodiments of the invention, the photosensitive array is comprised of a plurality of pixels arranged in any number of columns and rows. The two-dimensional polychrome imager embodiments of this invention have the advantages of minimizing contact edges between adjacent pixels, so that there is significantly less chance of color cross-talk. Color filter fabrication is simplified in that similar color pixels are arranged so as to be diagonally aligned, and diagonal ribbon or strip filters may be employed.

The above and many other objects, features, and advantages of this invention will be more fully appreciated from the ensuing description of a preferred and exemplary embodiment, which is to be read in conjunction with the accompanying Drawing.

DETAILED DESCRIPTION OF THE PREFERRED EMBODIMENT

Figure 4:
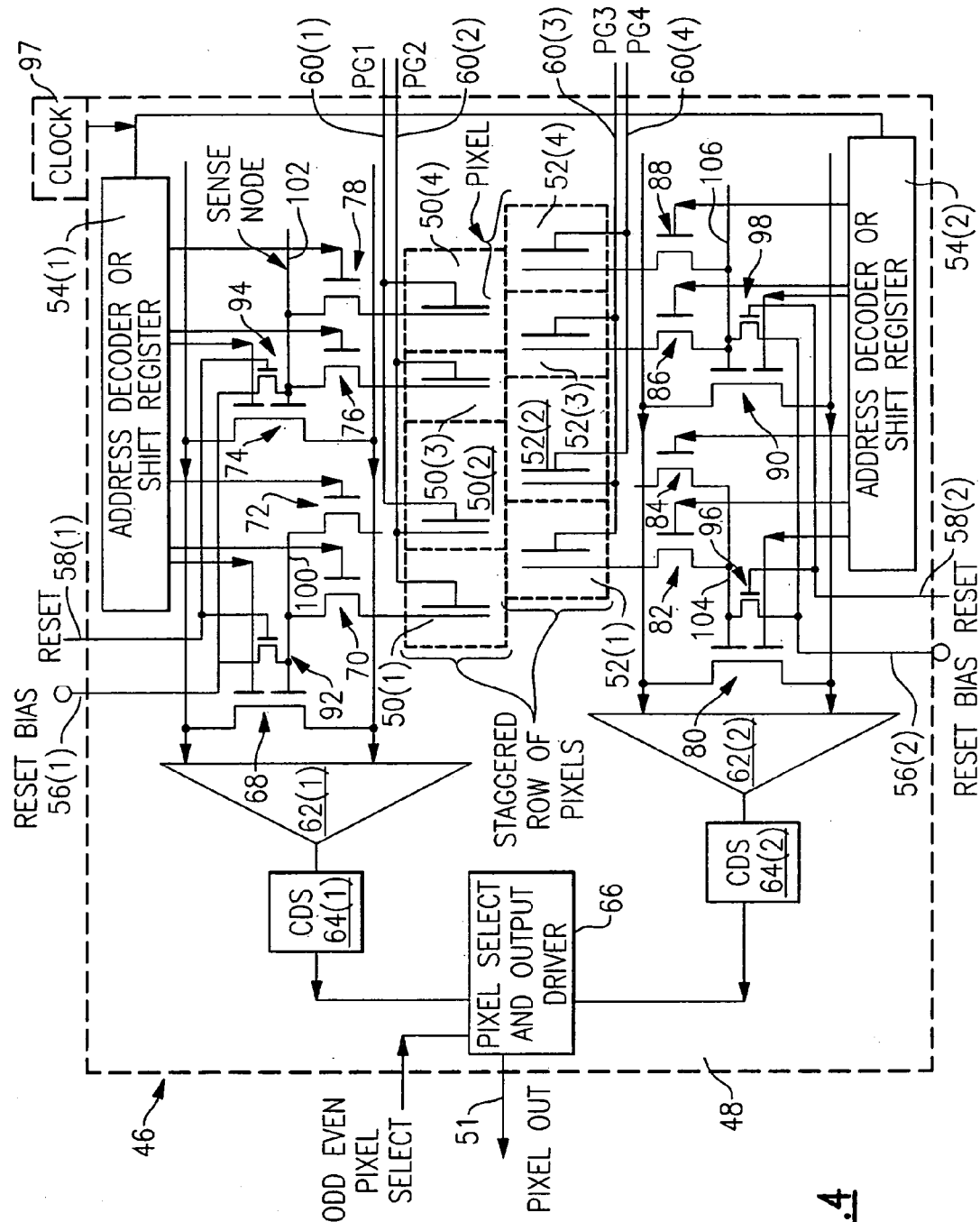
FIG. 4 is a partial block diagram and partial circuit diagram of a CMOS imaging system in accordance with one embodiment of the invention.

With reference now to the Drawing, and initially to FIG. 4 thereof, a system 40 for capturing an image of an object 42, e.g., text, in accordance with an embodiment of the invention includes a lens 44, a CMOS imaging system 46, an image control processing system 47, and an output bus 51. Other equivalent components could be used. The image control processing system 47 may be included on the CMOS sensor 46 to eliminate need for a separate component and reduce overall cost. The present invention provides a system for capturing an image with greater flexibility and lower cost than prior systems that use CCD or CIS technology. Additionally, the present invention provides a unique offset pixel structure for use in the CMOS imaging system 46.

Figure 1:
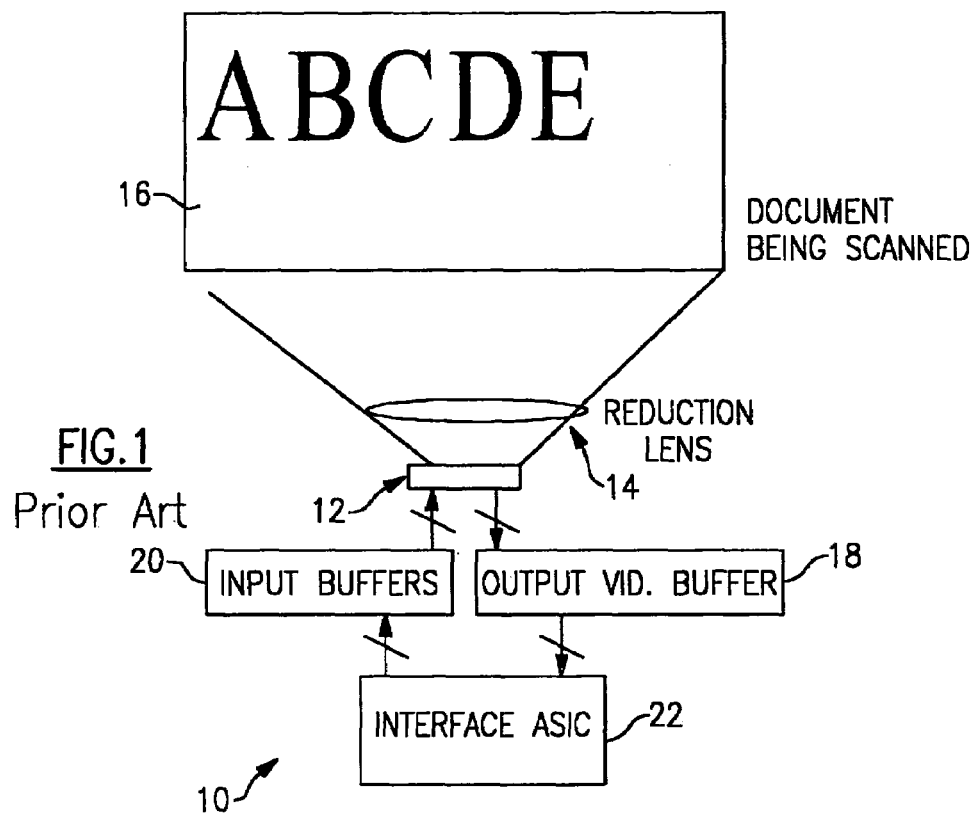
FIG. 1 is a schematic diagram of a CCD scanning system according to the prior art.
Figure 2:
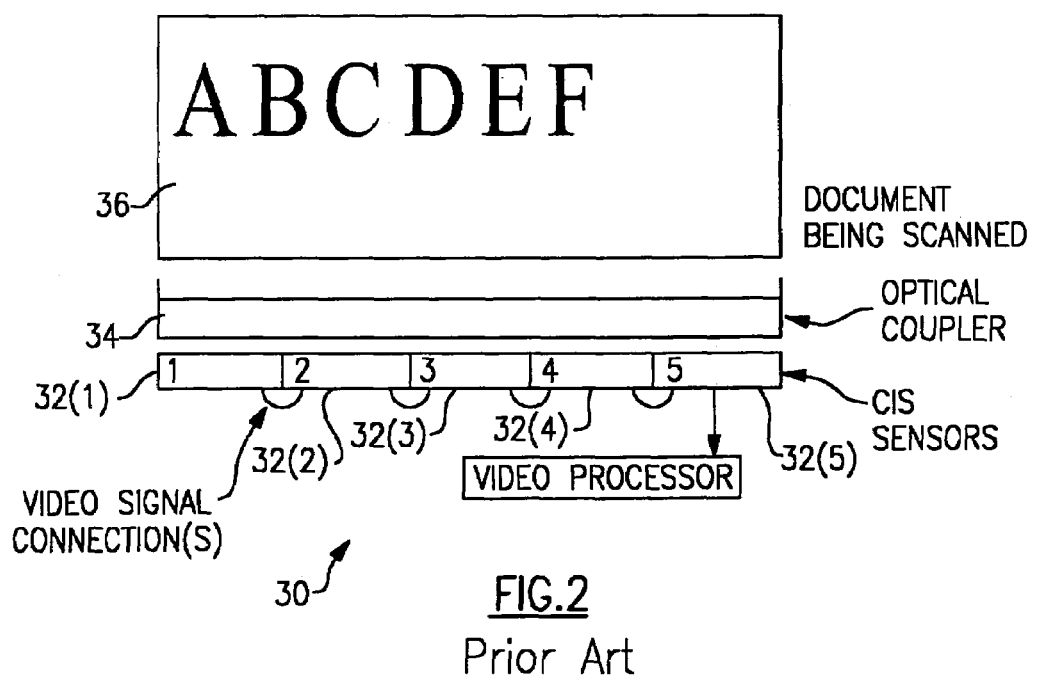
FIG. 2 is a schematic diagram of a CIS scanning system according to the prior art.
Figure 3:
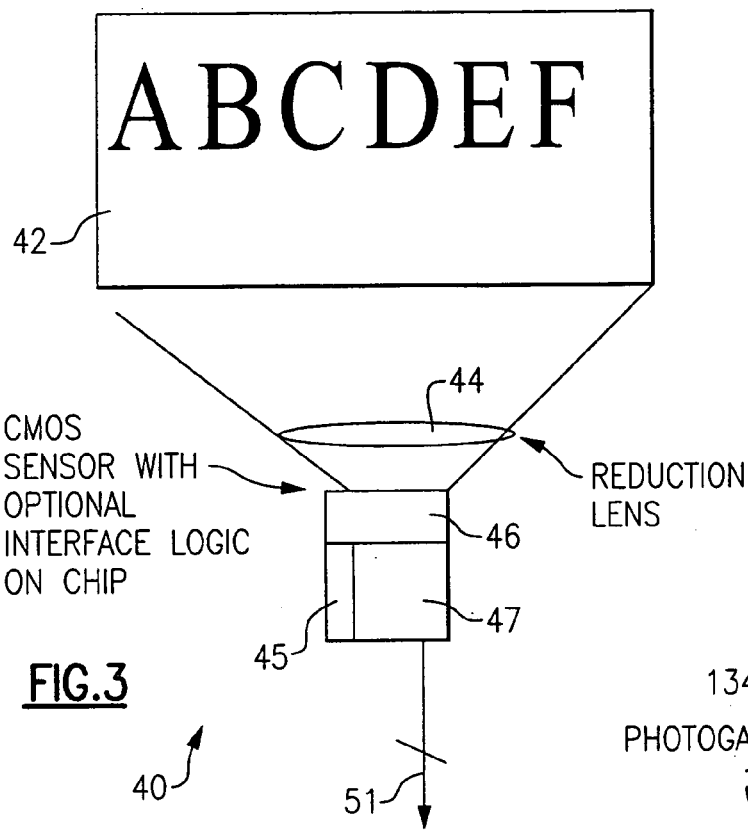
FIG. 3 is a schematic block diagram of a CMOS system for capturing an image in accordance with one embodiment of the invention.

As shown in FIG. 3, the lens 44 is positioned in the system to focus or direct the image being scanned or otherwise captured onto the CMOS imaging system 46. In this embodiment, the lens 44 reduces the image being scanned onto the CMOS imaging system, although the lens could be used to focus the image in another manner, such as direct transfer without any reduction or with or without enlargement of the image. Additionally, although the lens 44 is shown, other types of focusing and image forming systems could be used to focus or direct the image to be scanned onto the CMOS imaging system, such as a mirror or mirror-and-lens combination.

With reference now to FIG. 4, the CMOS imaging system 46 is formed on a CMOS chip and includes a CMOS imager 48 with a pair of staggered series of pixels 51 (1) to 50(4) and 52(1) to 52(4), such as rows or columns of pixels; a pair of address decoders 54(1) and 54(2), a pair of reset biases 56(a) and 56(2); a pair of reset selects 58(1) and 58(2), a pair of photogate selects 60(1) and 60(2); a pair of operational amplifiers 62(1) and 62(2); a pair of correlated double samplers (CDS) 64(1) and 64(2); a pixel select and output driver 66; and a plurality of field effect transistors. In other embodiments, the CMOS imaging system may comprise other components and arrangements. In this embodiment, the term "pixel" refers to the photosensitive element and the pixel control circuitry, although other arrangements are possible, in which a pixel could encompass substantially only the photosensitive element.

In the FIG. 4 embodiment, first and second series of pixels 50(1) to 50(4) and 52(1) to 52(4) are adjacent to each other and the second series of pixels 52(1) to 52(4) is offset from the first series of pixels 50(1) to 50(4) by one-half the pixel pitch. In other embodiments, the first and second series of pixels 50(1) to 50(4) and 52(1) to 52(4) could have other spacing arrangements, and could be offset by a different amount or different pitch. The series of pixels can have differing numbers of pixels. Additionally, although the two series of offset pixels 50(1) to 50(4) and 52(1) to 52(4) are shown, the CMOS imager 48 could have other configurations, such as a single series of pixels or three or more series of pixels. If multiple series of pixels are included, then the series of pixels would optimally be offset by a reciprocal of the total number of series of pixels, e.g., if there are three series of pixels, then the pixels will be offset from each other by one-third; if there are four series of pixels, then the pixels will be offset from each other by one-quarter, etc. Other arrangements can be used, such as having the series of pixels offset by other amounts or having some of the series of pixels with are not offset. With the offset series of pixels 50(1) to 50(4) and 52(1) to 52(4), the output from the first series of pixels 50(1) to 50(4) can be interleaved with the output from the second series of pixels 52(1) to 52(4) in synchronism with the scanning motion. Interleaving the outputs will increase the resolution of the system 40 over that of a system with only a single series of pixels, without adding to the overall length of the system or device and without significant increase in cost.

The outputs of the CDS 64(1) and 64(2) are coupled to the output driver 66, which is coupled to the output bus 51 and the output of each amplifier is coupled to the input of one of the CDS 64(1) and 64(2). The sources and drains of the FETs 80 and 90 are coupled to the input of amplifier 62(2). In this embodiment, pixels 50(1) and 50(2) share the same sense node 100 which is coupled to one of the gates of FET 68, pixels 50(3) and 50(4) share the same sense node 102 which is coupled to one of the gates of FET 74, pixels 52(1) and 52(2) share the same sense node 104 which is coupled to one of the gates of FET 80, and pixels 52(3) and 52(4) share the same sense node 106 which is coupled to the gate of FET 90. The drain of FET 70 is coupled to another gate of FET 68 and the source of the FET 70 is coupled to the pixel 50(1), the drain of FET 72 is coupled to the same gate of FET 68 and the source of the FET 70 is coupled to the pixel 50(2), the drain of FET 76 is coupled to another gate of FET 74 and the source of the FET 76 is coupled to the pixel 50(3), the drain of FET 78 is coupled to the same gate of FET 74 and the source of the FET 78 is coupled to the pixel 50(4), the drain of FET 82 is coupled to another gate of FET 80 and the source of the FET 82 is coupled to the pixel 52(1), the drain of FET 84 is coupled to another gate of FET 80 and the source of the FET 82 is coupled to the pixel 52(1), the drain of FET 84 is coupled to the same gate of FET 80 and the source of the FET 84 is coupled to the pixel 52(2), the drain of FET 86 is coupled to another gate of FET 90 and the source of the FET 86 is coupled to the pixel 52(3), and the drain of FET 88 is coupled to the same gate of FET 86 and the source of the FET 88 is coupled to the pixel 50(4).

Address decoder 54(1) is coupled to the one gate of FET 68 and to the one gate of FET 74 and address decoder 54(2) is coupled to the one gate of FET 80 and to the one gate of FET 90. Address decoder 54(1) is also coupled to the gates of FETs 70, 72, 74, and 76 and address decoder 54(2) is also coupled to the gates of FETs 82, 84, 86, and 88. Address decoders 54(1) and 54(2) are also coupled together and to a clock 97 and a start pulse. A reset bias 56(1) is coupled to a source of FET 92 and to a source of FET 94, and a reset bias 56(2) is coupled to a source of FET 96 and a source of FET 98. A drain of FET 92 is coupled to the source of FET 70 and to the source of FET 72, a drain of FET 94 is coupled to the source of FET 76 and to the source of FET 78, a drain of FET 96 is coupled to the source of FET 82 and to the source of FET 84, and a drain of FET 98 is coupled to the source of FET 86 and to the source of FET 88. A reset select 58(1) is coupled to a gate of FET 92 and a gate of FET 94 and a reset select 58(2) is coupled to a gate of FET 96 and a gate of FET 98. A photogate select 60(2) is coupled to the pixels 50(1) and 50(3), and a photogate select 60(1) is coupled to pixels 50(2) and 50(4). A photogate select 60(3) is coupled to pixels 52(1) and 52(3) and a photogate select 60(4) is coupled to pixels 52(2) and 52(4).

The image control processing system 47 is coupled to and controls the reset selects 58(1) and 58(2), address decoders 54(1) and 54(2), the photo gate selects 60(1) and 60(2), and the output driver 66 in the CMOS imaging system 46, although the image control processing system 47 could be coupled to other components. The image control processing system 47 includes a central processing unit (CPU) or processor or dedicated logic, a memory, and a transceiver system which are coupled together by a bus system or other link, respectively, although the image control processing system 47 may comprise other components and arrangements. The processor in the image control processing system 47 executes one or more programs of stored instructions for image processing, such as controlling the integration time of each series of pixel to insure a uniform integration period or to control the integration period for different series of pixels so that it is different for different colors, controlling binning of pixels between sets of series of pixels, such as rows or columns of pixels, and controlling when and which pixels in a series are skipped to increase resolution as well as other instructions, such as for video functions, printer motor driver controls, sheet feed controls, paper sorting controls, print head controls, a user interface, faxing and modem capabilities.

These programmed instructions either for the CPU or processor or dedicated logic are stored in the memory, although some or all of those programmed instructions could be stored and retrieved from one or more memories at other locations. A variety of different types of memory storage devices, such as a random access memory (RAM) either static or dynamic or a read only memory (ROM) in the system or a floppy disk, hard disk, CD ROM, or other computer readable medium which is read from and/or written to by a magnetic, optical, or other reading and/or writing system that is coupled to the processor, can be used for memory. The transceiver system is used to operatively couple and communicate between the image control processing system 47 and other systems, such as the CMOS imaging system 46. A variety of different types of computer interfaces could be used, such as infrared, USB, Blue Tooth, 811.XX, parallel port, 1394, Camera Link, DVI, or SMPTE 29X. In this particular embodiment, the image processing functions are in the image control processing system 47 as in FIG. 3, which is on the same CMOS chip as the CMOS imaging system 46, although other arrangements could be used, such as having all of the functions for the image processing as well as other functions, e.g., a desk top scanner or MFP, included in the CMOS imager 48 on the same chip or in separate components from the CMOS imaging system 46 on other chips which are then coupled together.

A power monitoring system 45 is coupled to the CMOS imaging system 46 and on the CMOS chip, although the power monitoring system 45 could be a component located on another chip and coupled to the chip with the CMOS imaging system 46. The power monitoring system 45 monitors the CMOS imaging system 46 to detect when the CMOS imaging system 46 is not in use, e.g. not capturing an image or transferring an image out, and then shutting down power consumption during non use periods to save power.

Figure 5:
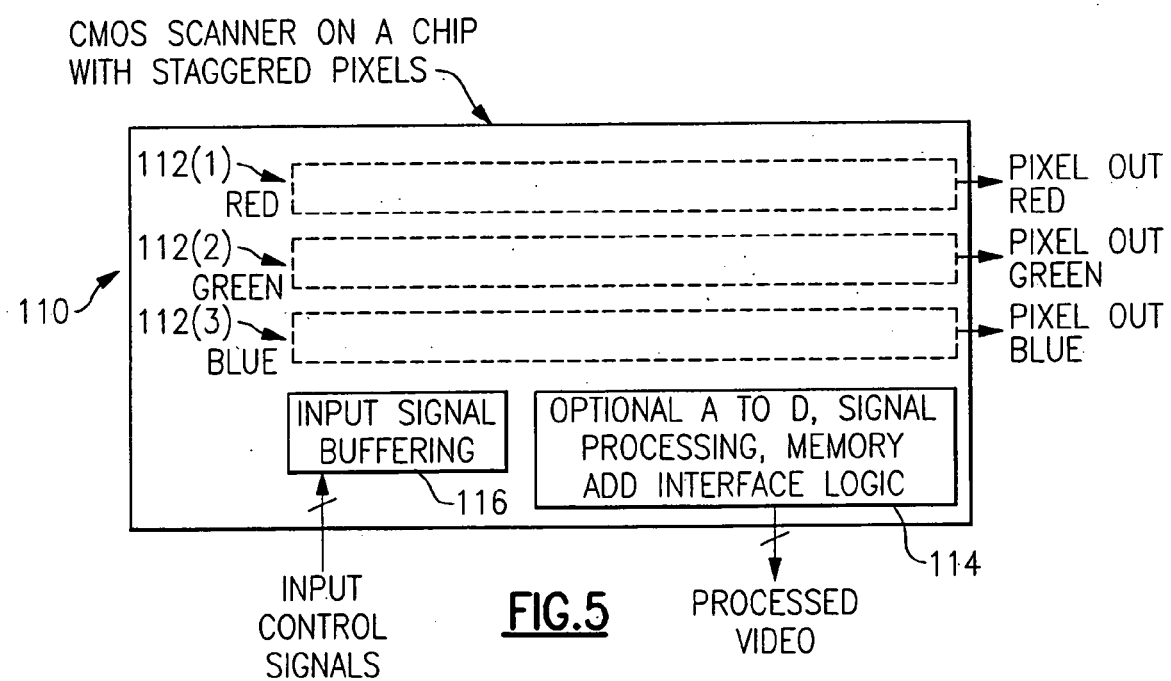
FIG. 5 is a block diagram of a CMOS imaging system in accordance with another embodiment of the invention.
Figure 6:
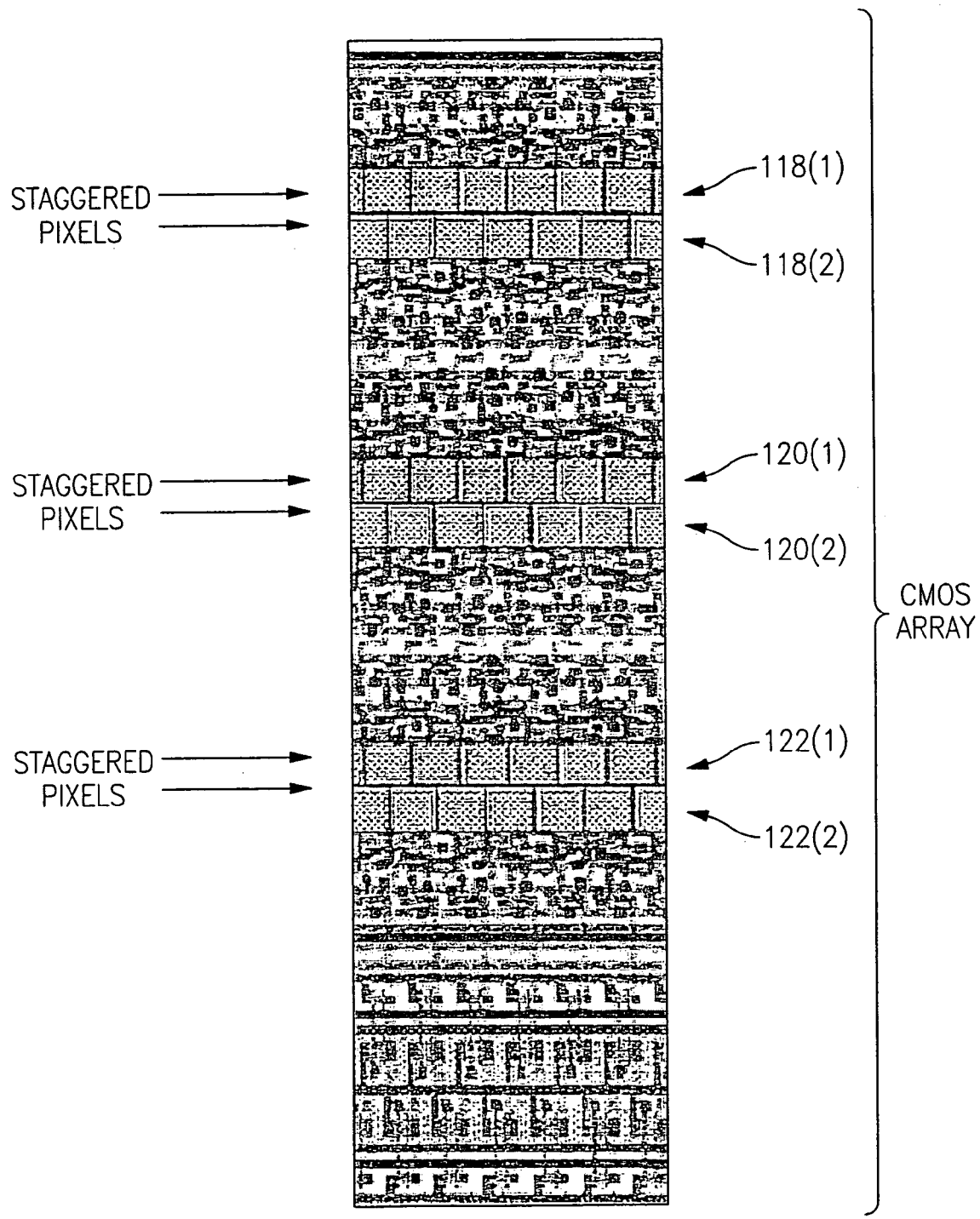
FIG. 6 is a diagram of three sets of offset series of pixels for the CMOS imager(s) shown in FIG. 5.

Referring to FIG. 5, a CMOS imaging system 110 for use in color scanning applications includes three CMOS imagers 112(1)–112(3) where each of the CMOS imagers 112(1)–112(3) represents a different color band, although other arrangements can be use, such as having other numbers of CMOS imagers and/or having the CMOS imagers represent the same color band or having monochrome imagers. The CMOS imagers 112(1)–112(3) may also be used to capture the same color band or may be monochrome. With multiple CMOS imagers 112(1)–112(3) other operations, such as binning of the signal from a pixel in one series in one of the CMOS imagers 112(1)–112(3) with the signal from a pixel in one series in another one of the CMOS imagers 112(1)–112(3), can be executed. Except as described herein, the structure and operation of CMOS imagers 112(1)–112(3) are the same as the CMOS imager 46 described with reference to FIG. 4 and thus will not be described in detail here. Each of the CMOS imagers 112(1)–112(3) has a set of series of pixels 118(1)–118(2), 120(1)–120(2), and 122(1)–122(2) as illustrated in FIG. 6.

In this particular embodiment, the color bands represented by the CMOS imagers 112(I)–112(3) are red, green and blue, although other color bands can be represented such as Cyan, Magenta and Yellow. These may be non-visible bands, such as UV or IR. A color filter is placed over each series of pixels 118(1)–118(2), 120(1)–120(2), and 122(1)–122(2) for the particular color band. In this particular embodiment, red, green, and blue color filters are used.

In this particular embodiment the image control processing system 114 is on the same chip as the CMOS imagers 112(1)–112(3), although the image control processing system 114 could be located in a separate component coupled to the CMOS imagers 112(1)–112(3) as shown in the embodiment in FIG. 3. The structure and operation of the image control processing system 114 is the same as the image control processing system 47 described with reference to FIGS. 3 and 4. The image control processing system 47 is used to control the operation of the CMOS imagers 112(1)–112(3) including functions in each CMOS imager 112(1)–112(3), such as controlling the integration time of each series of pixel to insure a uniform integration period or to control the integration period for different series of pixels so that it is different colors, controlling binning of pixels between sets of series of pixels, such as rows or columns of pixels, and controlling when and which pixels in a series are skipped to increase frame rate as well as other instructions, such as for video functions, printer motor driver controls, sheet feed controls, paper sorting controls, print head controls, a user interface, faxing and modem capabilities. Methods for controlling integration periods, binning of pixels and skipping pixels are disclosed in Pace et al. U.S. Pat. No. 6,084,229. CMOS imaging system 110 also includes an input buffer 116 which is coupled to CMOS imagers 112(1)–112(3) and is used to drive and control CMOS imagers 112(1)–112(3), including address decoders 54(1)–54(2), reset control 58(1)–58(2), CDS circuits 64(1)–64(2), photogate 60(1)–60(4), clock 97 and start 98, pixel select 66, a global reset of system 47, sense node resets 100, 102, 104, and 106, pixel skip or pixel binning and power down modes to eliminate power consumption when not in use.

The operation of the system 40 for capturing an image will now be described with reference to FIGS. 3 and 4. The lens system 44 focuses or directs a reduced image of the image 42 being scanned or otherwise captured onto at least a portion of the series of pixels 50(1)–50(4) and 52(1)–52(4) in the CMOS imager 48 in the CMOS imaging system 46, although other configuration of directing the image 42 could be used, such as directing an actual sized version or an enlarged version of the image on the CMOS imager 48. Additionally other devices, such as a mirror, can be used to direct the image on the CMOS imager 48.

Figure 7:
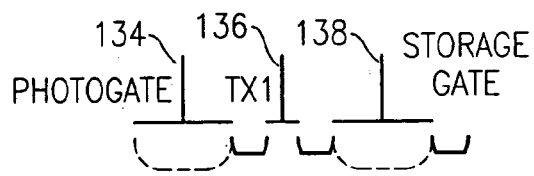
FIG. 7 is a diagram of one alternate pixel structure for use in the CMOS imaging system shown in FIG. 4 in another embodiment.

When the image 42 is directed onto the series of pixels 50(1)–50(4) and 52(1)–52(4) which have photosensitive elements used to capture the image, the pixels 50(1)–50(4) and 52(1)–52(4) will begin to integrate the reduced image depending on the status of the photogate selects 60(1)–60(4) which are controlled by the image control processing system 47. The read out sequence of operation is to capture the image on the pixels 50(1)–50(4) and 52(1)–52(4), reset one or more of the sense nodes 100, 102, 104 and 106, by reset control 58(1)–(2), sensing the reset level for CDS and transferring one or more of the shared pixels onto each sense node by photogate control lines 60(1)–(4). In this particular embodiment, when one or more of the photogate selects 60(1)–60(2) are biased to one voltage level, such as zero volts by way of example only, then the rows of pixels cannot integrate or capture an image, such as an image of a document or other scanned object. When one or more of the photogate selects 60(1)–60(4) are biased to another voltage, such as 3.3 volts by way of example only, then the rows of pixels coupled to the photogate selects 60(1)–60(4) at 3.3 can integrate and capture the image. Once the image is captured, then one to all of the photogate selects 60(1)–60(4) are biased back to the first voltage level, which in this example was zero volts. Operation of the photogate selects 60(1)–60(4) operate in conjunction with the sense nodes 100, 102, 104 and 106. Operation of the sense node 100 is in conjunction of the address decoders selection of FET 70 and 72 and reset of FET 92. What is illustrated in FIG. 4 are two pixels sharing the same sense node 100, for this example only. The number of pixels sharing the same sense node can vary from one to many. The more pixels sharing the same sense node, the more Photogate control 60(X) lines are needed which adds complexity to timing. This can be overcome with intermediate storage between the pixels and the sense node, but such intermediate storage adds complexity to the pixel structure. One example of a pixel structure to accomplish this is shown in FIG. 7 and includes a photogate and storage gate. Next the pixels with the captured signals from the document being scanned are transferred to the sense nodes for reading. A photogate control line 60(1)–60(4) and the associated sense nodes 100, 102, 104 and 106 determine which pixels 50(1)–50(4) and 52(1)–52(4) are selected for reading. For photogate control 60(2) the sense nodes are 100 and 102 and the pixels to be read are 50(1) and 50(3) respectively. All the pixel signals are transferred in parallel for each of photogate control lines 60(1)–(4) and therefore the pixel select lines from address decoders 54(1) and 54(2) and associated with each photogate control 60(1)–(4) must be turned on by the address decoder 54(1) or 54(2) at the same time. Therefore, for photogate control 60(2), the sense nodes are 100 and 102, and the pixels to be read are 50(1) and 50(3) and the transfer FETs 70 and 76 must be selected by the address decoder 54(1) in parallel. The photogate control signal 60(2) is driven to zero to transfer charge on pixels 50(1) and 50(3) onto sense nodes 100 and 102. Then, the transfer FETs 70 and 76 are turned off by the address decoder 54(1) and photogate control 60(1) can then be rebiased to 3.3 Volts, for this example, and deplete the silicon under pixels 50(1) and 50(3) to begin integration for the next frame of integration. Now all of the pixels associated with photogate control 60(2) have the pixel information shuttered onto the sense nodes 100 and 102. Next, address decoders select which sense node 100 and 102 to read by selecting the control gate of FET 68 for output to the CDS circuit 64(1) by the operational amplifier 62(1) as described by U.S. Pat. No. 6,084,229 to Pace et al. and then the next pixel in sequence, if desired, is selected for reading by the address decoder 54(1) selecting the control gate of FET 74 and the sense node of 102 is read by operational amplifier 62(1) again.

This process is repeated again for pixels 50(2) and 50(4) being transferred on to sense nodes 100 and 102 after being reset by reset control 58(1), by the address decoder 54(1) selecting transfer FETs 72 and 78 and photogate control signal 60(1) then being driven to zero. The transfer control FETs 72 and 78 are turned off by the address decoder 54(1) to shutter the signal. The sense nodes 100 and 102 are selected for reading by the address decoder 54(1) by turning on the control gate of FET 68 to output the pixel through operational amplifier 62(1) and CDS circuits 64(1) and the control gate of FET 68 is turned off again. The next pixel desired is selected for reading by the address decoder 54(1) turning on the control gate of FET 74 to output the pixel through operational amplifier 62(1) and CDS circuits 64(1) and the control gate of FET 74 is turned off again. Photogate control 60(1) is rebiased to 3.3 Volts to begin the next integration period as desired.

This process is repeated again for pixels 52(1) and 52(3) being transferred on to sense nodes, 104 and 106 after being reset by reset control 58(2), by the address decoder 54(2) selecting transfer FETs 82 and 86 and photogate control signal 60(3) then being driven to zero. The transfer control FETs 82 and 86 are turned off by the address decoder 54(2) to shutter the signal. The sense nodes are selected for reading by the address decoder 54(2) by turning on the control gate of FET 80 to output the pixel through operational amplifier 62(2) and CDS circuits 64(2) and the control gate of FET 80 is turned off again. The next pixel desired is selected for reading by the address decoder 54(2) turning on the control gate of FET 90 to output the pixel through operational amplifier 62(2) and CDS circuits 64(2) and the control gate of FET 90 is turned off again. Photogate control 60(3) is rebiased to 3.3 Volts to begin the next integration period as desired.

This process is repeated again for pixels 52(2) and 52(4) being transferred on to sense nodes 104 and 106 after being reset by reset control 58(2), by the address decoder 54(2) selecting transfer FETs 84 and 88 and the photogate control signal 60(4) then being driven to zero. The transfer control FETs 84 and 88 are turned off by the address decoder 54(2) to shutter the signal. The sense nodes are selected for reading by the address decoder 54(2) by turning on the control gate of FET 80 to output the pixel through operational amplifier 62(2) and CDS circuits 64(2) and the control gate of FET 80 is turned off again. The next pixel desired is selected for reading by the address decoder 54(2) turning on the control gate of FET 90 to output the pixel through operational amplifier 62(2) and CDS circuits 64(2) and the control gate of FET 90 is turned off again. Photogate control 60(4) is rebiased to 3.3 Volts to begin the next integration period as desired.

Normally photogate control signals of a series of pixels are all rebiased to 3.3 simultaneously to have a uniform integration time. The shared sense node 100, 102, 104 and 106 between pixels 50(1) and 50(2), 50(3) and 50(4), and 52(1) and 52(2), and 52(3) and 52(4), respectively, allow adjacent pixels 50(1) and 50(2), 50(3) and 50(4), and 52(1) and 52(2), and 52(3) and 52(4) in a series to be binned together by transferring both pixels of the shared sense node at the same time. This can be accomplished by this example when the address decoder 54(1) selects transfer FETs 70 and 72 at the same time and photogate control 60(1) and 60(2) are operated simultaneously as well. All pixels 50(1)–50(4) connected to photogate control signals 60(1) and 60(2) will be transferred at the same time and all transfer gates will need to be selected at the same time. Otherwise the sense node reset, transfer and reading are the same as previously described. One or more pixels 50(1)–50(4) and 52(1)–52(4) can be skipped as desired by the address decoders or shift registers 54(1) and 54(2); while maintaining the maximum read out speed for higher frame rate. Also, by utilizing the amplifier configuration of U.S. Pat. No. 6,084,229 to Pace et al., the address decoders 54(1) and 54(2) can select multiple sense nodes 100, 102, 104 and 106 of a series of pixels 50(1)–50(4) and 52(1)–52(4), by way of this example, at the same time for the darkest signal on the selected sense nodes, is the signal that will dominate the output of operational amplifier 62(1). The darkest signal is the signal with the highest level for a selected sense node and is the sense node that will be saturated to complete the operational amplifier of U.S. Pat. No. 6,084,229 to Pace et al. for the NFETs shown of FIG. 4. This method of selecting the darkest pixel when multiple sense nodes are selected is called "auto black binning". The whitest pixel can be selected in the same manner if sense FETs 68, 74, 80 and 90 are PFETs instead of NFETs as shown in FIG. 4 and in this case called "auto white binning". In scanning applications where the paper is often white and the text being imaged is black. The order in which the pixels 50(1)–50(4) and 52(1)–52(4) are read can occur in a predetermined sequence from a shift register or random address decoder 54(1) and 54(2) and how many series of pixels are multiplexed or interleaved by the pixel select and output driver 66. Extra control lines may be required to change to pixel order and this implementation would be apparent to those of ordinary skill in the art and thus is not shown here. Although, the shuttering operation is complete when binning all pixels 50(1) and 50(2), 50(3) and 50(4), 52(1) and 52(2), 52(3) and 52(4) within a sense node 100, 102, 104 and 106, a potential problem arises when reading out pixels that share a sense separately. A problem arises when the pixels of the shared sense node have a delay between photogate control signals, transferring charge at different time, which causes pixels of the same series to have slightly different integration times. A solution to this problem is to have a storage site per pixel as illustrated in FIG. 7.

The signals from the output of amplifiers 62(1) and 62(2) are supplied to CDS 64(1) and 64(2) and the outputs of the CDS 64(1) and 64(2) are coupled to the output driver 66 which outputs the signals to an output bus 51 in this example. Accordingly, with the present invention signals from the pixels 50(1)–50(4) and 52(1)–52(4) in the CMOS imager 48 in the CMOS imaging system 46 independently selected and coupled to the output 51 in any order desired. For example, the signals from the pixels 50(1)–50(4) and 52(1)–52(4) can be interleaved to increase resolution without substantially increasing the length or size of the imaging system 46 or if some of the signals on the pixels 50(1)–50(4) and 52(1)–52(4) are selected and others skipped, the frame rate can be increased, but at a lower resolution for the resulting image.

The operation of the system 40 for capturing an image with the CMOS imaging system 110 with CMOS imagers 112(1)–112(3), replacing the CMOS imaging system 46 will now be described with reference to FIGS. 3, 5, and 6. The operation of each of the CMOS imagers 112(1)–112(3) in FIG. 5 is the same as the CMOS imager 48 in FIG. 4 except as described herein. With this system, the lens 44 focuses or directs a reduced image of the image being scanned or otherwise captured onto the series of pixels 118(1)–118(2), 120(1)–120(2), and 122(1)–122(2) on the CMOS imagers 112(1)–112(3) in the CMOS imaging system 110, although again other configurations for directing the image could be used, such as directing an actual sized version or an enlarged version of the image on the CMOS imagers 112(1)–112(3). Additionally other devices, such as a mirror, can be used to direct the image on the CMOS imagers 112(1)–112(3).

In this particular embodiment, a different filter is over each of the sets of series of pixels 118(1)–118(2), 120(1)–120(2), and 122(1)–122(2) in the CMOS imagers 112(1)–112(3) and the filters filter out red for series of pixels 118(1)–118(2) in CMOS imager 112(1), green for series of pixels 120(1)–120(2) for CMOS imager 112(2), and blue for series of pixels 122(1)–122(2) for CMOS imager 112(3), although the CMOS imagers 112(1)–112(3) could each be filtered to capture other information or could be monochrome. The process for capturing and processing the signals from each of the series of pixels 118(1)–118(2), 120(1)–120(2), and 122(1)–122(2) in the CMOS imagers 112(1)–112(3) is the same as described above for the series of pixels 50(1)–50(4) and 52(1)–52(2) in CMOS imager 48 in FIG. 4.

For the CMOS imaging system 110 with the three CMOS imagers 112(1)–112(3), the integration time of each series of pixels 118(1)–118(2), 120(1)–120(2), and 122(1)–122(2) in each of the CMOS imagers 112(1)–112(3) for the different color bands can be independently controlled. With independent control of integration time for each of the CMOS imagers 112(1)–112(3), each of the CMOS imagers 112(1)–112(3) can receive a different amount of light for the corresponding color band from the light source. If each color is allowed to integrate for a slightly different amount of time, then the color balance can be achieved during the integration period, rather than through post processing by an image processor. This simplifies the scanning or imaging operation and improves the signal-to-noise balance of the three color channels. Optionally, a black reference series of pixels or a few black reference pixels are added to each series of pixels 118(1)–118(2), 120(1)–120(2), and 122(1)–122(2) in the CMOS imagers 112(1)–112(3). Another option is to add a monochrome series of pixels to the CMOS imagers 112(1)–112(3) as a reference to assist with line art and text-only scanning applications.

With the CMOS imaging system 110 with the three CMOS imagers 112(1)–112(3), other methods may also be carried out. For example, signals from pixels from different CMOS imagers 112(1)–112(3) may be binned to combine the signals together before being output. Binning provides a lower resolution at higher frame rate. Binning is often defined as summation of adjacent signals or data from pixels and is accomplished by transferring more than one signal from pixels on to the same node, such as an output bus 51.

An alternative pixel structure to pixels in series 50(1)–50(4) and 52(1)–52(4) is illustrated in FIG. 7. All other circuit aspects of FIG. 4 remain the same for this example. All timing remains as previously described with the following exceptions. Photogate control for a series of pixels 60(1)–(4) as shown in FIG. 4 remains the same and the connection from one of these photogate controls 60(1)–(4) is shown as an input to a FET 138 for the storage gate. Prior to transferring the photon generated charge to sense nodes 100, 102, 104 and 106, in this example there are two extra timing steps that must occur first, and two extra FETs 136 and 138 have been added to assure uniform integration of all pixels in series. After pixels 50(1)–50(4) and 52(1)–52(4), such as the pixel adjacent FET 134 which represents one of the pixels 50(1)–50(4) and 52(1)–52(4), have integrated signal for the desired period, all pixels 50(1)–50(4) and 52(1)–52(4) have the photon generated charge transferred through TX1 by selecting a gate of FET 136 and biasing a storage gate under FET 138 to 3.3 Volts, for this example, and turning off the photogate 134 by biasing the photogate 134 to zero volts and turning off TX1. Now the storage gate under FET 138 takes the place of one of the photogate controls 60(1)–(4) and the timing is the same as previously described. The pixel integration can resume immediately by rebiasing photogate 134 to 3.3 Volts by this example. The arrangement of FIG. 7 allows for uniform integration of all pixels and complete control of pixel binning, skipping and allowing "auto black binning" or "auto white binning" in any sequence desired.

Figure 8:
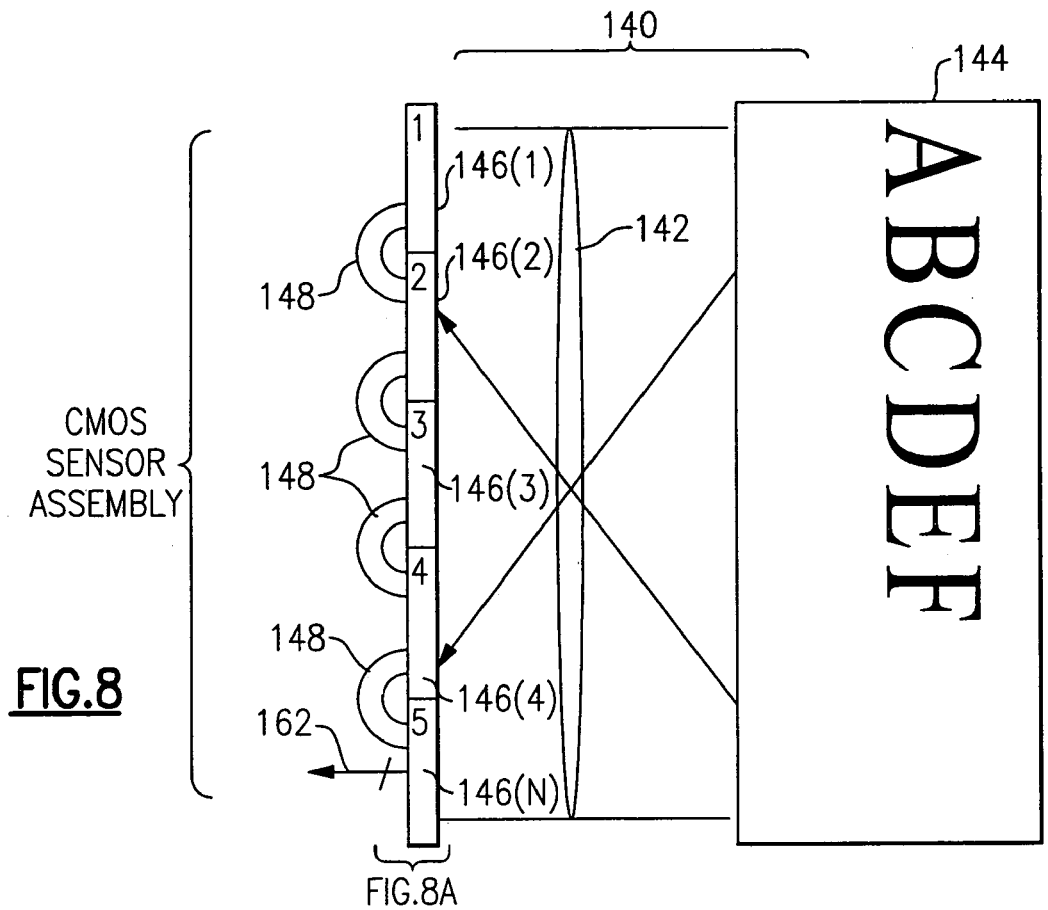
FIG. 8 is a schematic diagram of a CMOS scanning according to one possible embodiment of this invention.

Now referring to FIG. 8, a scanning system 140 includes a focusing system 142, e.g., a lens group which may be a reducing, enlarging, or one-power system, which forms an image of a document 144 to be scanned onto a CMOS imaging system 146. The imaging system 146 is formed of a series of CMOS imagers 146(1) to 146(N) butted end-to-end. Each of these imagers 146(1) to 146(N) employs one or more series of staggered of pixels, with the series being, e.g., as rows or columns of pixels, and including other control circuitry, timing circuitry, and address decoders as described in connection with the Active Column Sensor (ACS) as taught by Pace et. al. U.S. Pat. No. 6,084,229. Each of these imagers has for each series (or pair of series) of pixels, a pair of internal video connections to complete the distributed amplifier for internal row(s) or columns(s) as the sensor may be wired. By connecting the Source and Drain lines to other Source and Drain lines of other imagers in parallel into a single effective system, only the amplifier(s) on a single one of these imagers will need to be used. By connecting the source and drain lines in parallel, all pixels in a series, when addressed, will complete only one amplifier, minimizing the offsets between imagers and all pixels will have the same linearity as only one operational amplifier would have. Video signal conductors or jumpers 148 are shown here to join the Source and Drain conductors of the individual imagers 146(1) to 146(N) to one another.

Figure 8A:
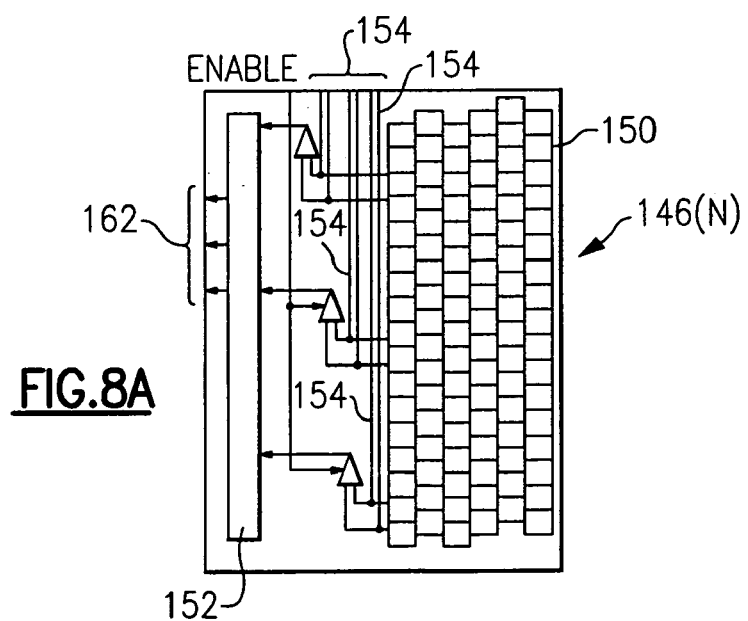
FIG. 8A is a partial schematic diagram of a portion of the embodiment of FIG. 8.

As shown in more detail in FIG. 8A, in this embodiment there is a set 150 of three pairs of series of staggered or offset pixels, e.g., red, blue, and green series for color scanning, in each of the imagers 146(1) to 146(N), only an end one of which 146(N) is shown here. Each such imager also has control and enable circuitry 152 that extends along one edge, and respective video output amplifiers 160, 162, and 164 associated with each series of pixels or in some embodiments with each pair of series of pixels. As described before in relation to the ACS imager design, each of the amplifiers 160, 162, 164 has its inputs joined to the Source and Drain conductor pair 154 or a respective series of pixels. In this case, the jumpers 148 link these conductors 154 from one chip to the next, and only the output amplifiers 160, 162, 164 from this single imager 146(N) are employed to deliver the video output signal to a following stage.

Figure 9:
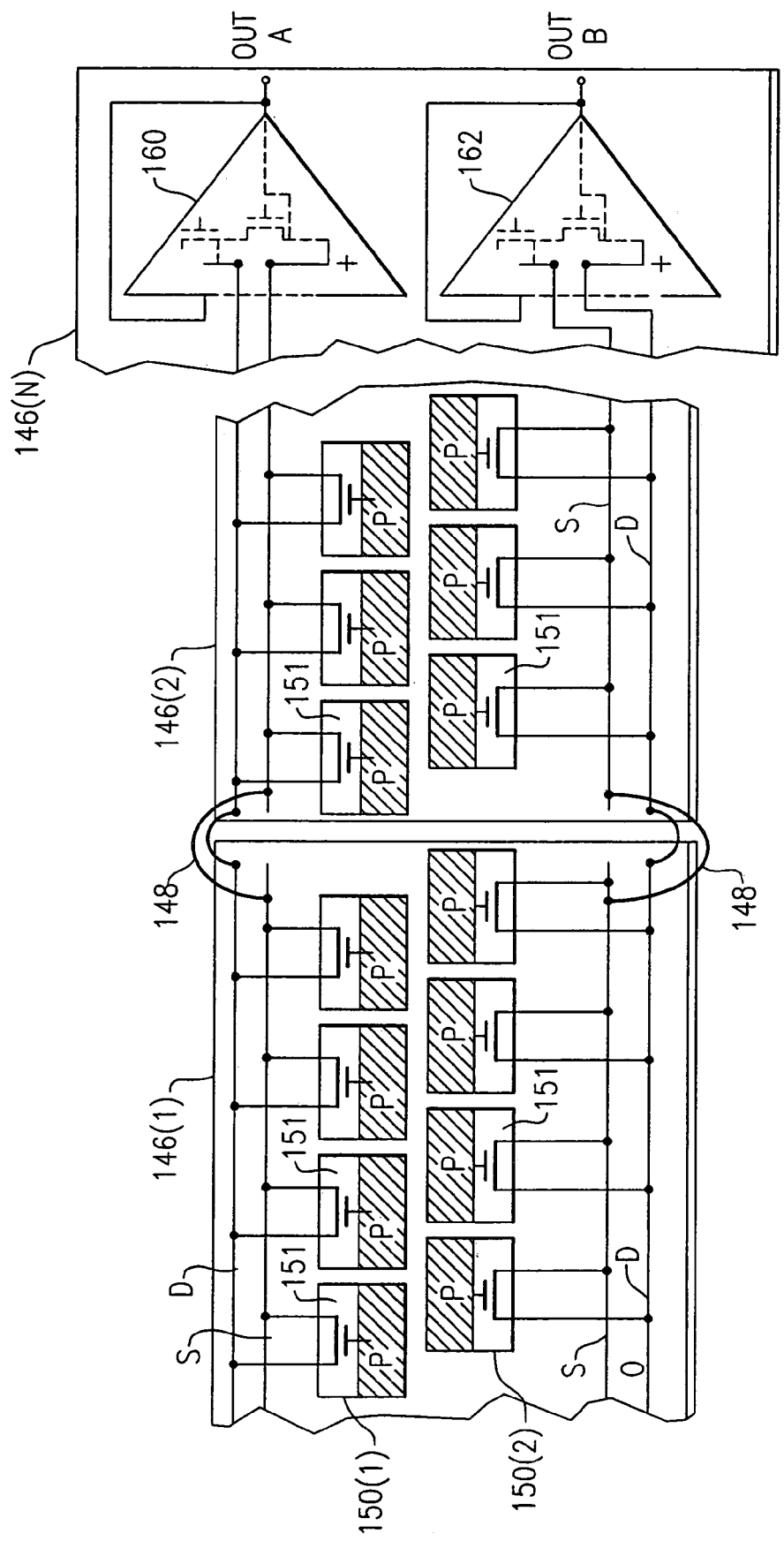
FIG. 9 is a schematic diagram illustrating a series of CMOS imager ICs which may be employed in the embodiment of FIG. 4.

A simple monochrome arrangement is illustrated in FIG. 9 to demonstrate the principle of connection of abutting imager ICs 146(1) to 146(N). Here, one imager 146(1) is shown abutting a second one of the imagers 146(2), with jumpers or conductor wires 148 joining the Source and Drain conductors S, D from one imager to the next. One series of pixels 150(1) is shown here with its individual pixels offset from a second series of pixels 150(2) by a one-half pitch, although other offsets could be employed in other applications. Each pixel has an output FET 151 with a gate coupled to a photosensor P of the pixel, and with its source and drain electrodes coupled to the conductors S, D respectively. Timing and control circuitry and other ancillary circuitry is omitted here to avoid drawing clutter, but would be understood to be present in a practical embodiment. As with the other embodiments described earlier, the control circuitry can effect selective skipping of red-out of the pixels within one or more series of pixels, which permits control over resolution and frame rate.

The output amplifiers 160, 162 in an Nth one of these imagers 146(N) have their inputs coupled with the Source and Drain conductors of that imager 146(N), which are connected by means of the jumper conductors 148 to the respective conductors of the remaining imagers, and these output amplifiers provide video outputs to a next stage. Correlated double sampler circuitry can be included here, as may be seen in the aforesaid Pace et al. U.S. Pat. No. 6,084,229. The output amplifiers 160, 162 each are configured as a balance amplifier with one FET balancing, in turn, the FET 151 of each respective pixel, as the pixels are read out in sequence. Each output amplifier 160, 162 forms a feedback circuit as well, and this is described in the aforesaid Pace et al. U.S. Pat. No. 6,084,229. The use of common amplifiers for each series of pixels on all the individual imager IDs 156(1) to 156(N) avoids any offset in the video output signal from one chip to the next.

Prior art CIS or CCD sensor based systems lack a closed loop or common feedback of one amplifier among pixels in a series or across multiple imagers. Active Pixel Sensors (APS) are typically configured as source followers with the attendant gain variations and offset variations, as source follower buffers are open loop configurations.

Figure 10:
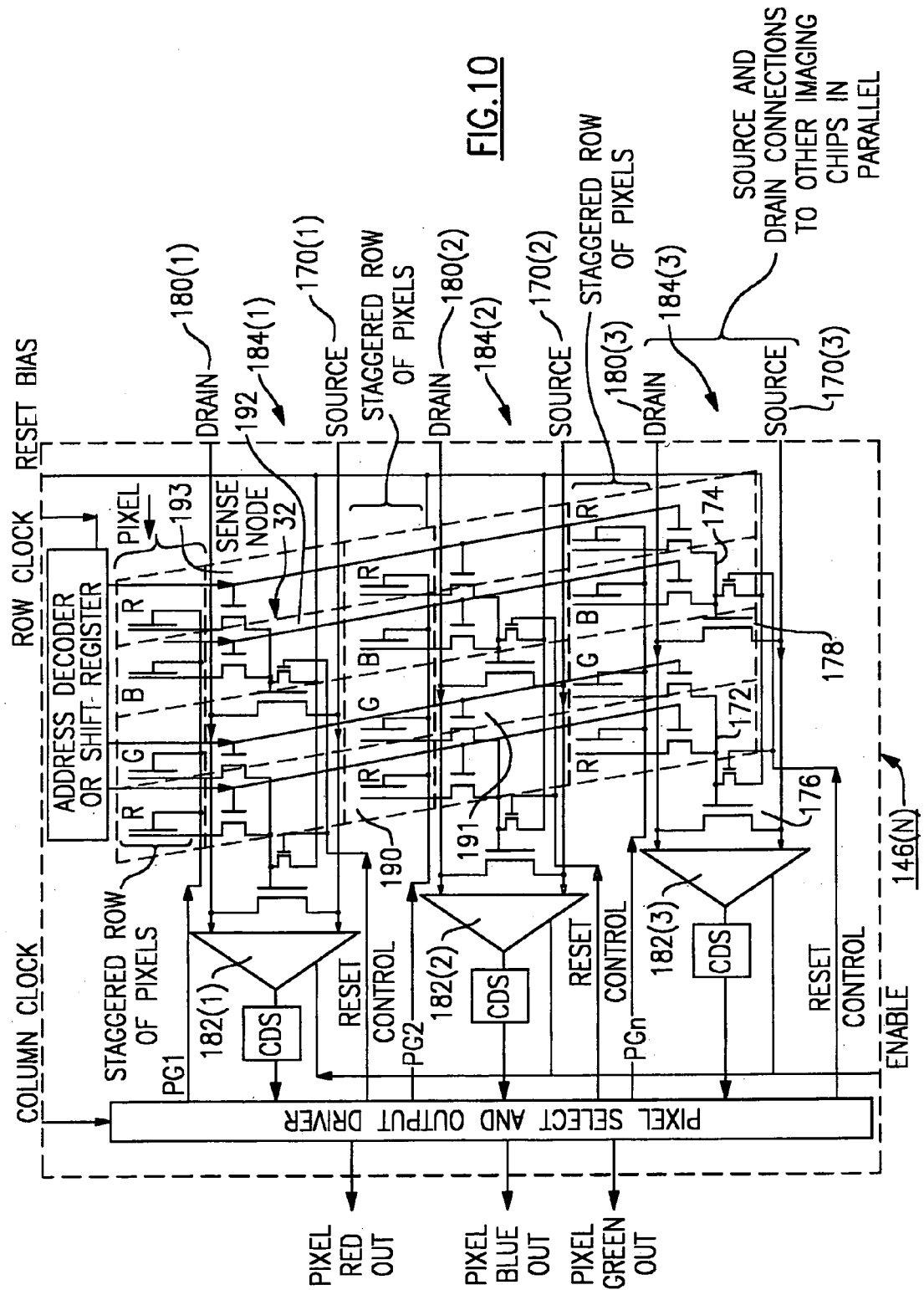
FIG. 10 is a schematic diagram illustrating an imager with multiple series of offset pixels in accordance with an embodiment of this invention.

The internal source and drain lines are shown in greater detail on FIG. 10, which illustrates one practical embodiment. In this view, a portion of only one imager 146(N) is shown schematically. The pixels here are arranged in series, with source connections 170(1) to 170(3) and drain connections 180(1) to 180(3) illustrated. The source connections and drain connections are the bias lines that have all sense nodes (e.g. 172 and 174) shown connected to an FET 176 that completes the amplifier 182(1) to 182(3) when selected. This is an ACS configuration as taught by Pace et. al. U.S. Pat. No. 6,084,229, to which reference may be had. The source and drain connections of this imager 146(N) are wired in parallel with the corresponding connections of all the other imagers 146(1) to 146(N–1). By connecting all pixels of a series from each sensor to pixels of the corresponding series of the other sensors of the image capture system, all pixels wired in parallel will complete the same amplifier, minimizing offset variations and gain variations that plague the prior art. Each buffer and amplifier has it own gain and offsets; thus, as long as there is only a single amplifier for each series of pixels, then gain and offset variations are limited to those of the one amplifier. The CMOS imaging system may comprise other components and arrangements. In this particular embodiment, the term pixel refers to the photosensitive element plus the associated the pixel control circuitry, although other arrangements are possible, such as that in which the pixel would comprise just the photosensitive element. The system can be configured with imagers abutted end-to-end to extend the effective length of the image that can be captured. The length of a single-chip system is limited due to the semiconductor wafer fabrication limitations and wafer yield issues, but by butting imagers end-to-end, such yield and length limitations can be overcome. The system can be extended along the width direction also, in the same manner, up to the size and yield limitations of the semiconductor wafer fabricator and thus a multi-imager two-dimensional system can be formed in the same manner as shown and described here.

As shown in FIG. 10, in a color system the pixels of a given color (R, G, B) are offset so as to be aligned along a given diagonal axis, and the diagonally aligned pixels can be overlaid with respective color filters 190, 191, 192, 193, etc. This geometry permits continuous ribbon filters or strip filters to be laid down adjacent one another to facilitate fabrication. In addition, this arrangement has the advantages that pixels abut pixels of another color only along portions of two sides, which reduces occurrence of color crossover.

Also, shown in FIG. 10, in this particular embodiment, there are multiple series of pixels 184(1), 184(2), 184(3), and the series of pixels are adjacent to each other with the adjacent series 184(2) of pixels is offset from the first series of pixels 184(1) by one-half the pixel pitch, although series of pixels 184(1) to 184(3) could have other pitches or offsets. First, second, and third series of pixels 184(1) to 184(3) could have other spacing arrangements, the different series of pixels could be offset by other amounts, and each of the series of pixels can have a multitude of pixels in series. Each series of pixels can be offset by different arrangements, where desired to have overlapping and offsetting series of pixels in order to enhance resolution.

Where the pixels are arranged in an offset configuration and the system is a color system, the associated color filters can be arranged along a series, orthogonal to the series of pixels or in a matrix (e.g. Bayer matrix) as is commonly done in prior art. The color filters need to be aligned directly over the pixels to minimize stray light that causes color impurities. Here, in order that the color filters be aligned along the pixels that are offset from each other, the color filters will in effect be oriented at an angle. This creates a diagonal scan arrangement, which can result in enhancement of resolution due to offset pixels and a reduction in the detrimental effects of color filter aliasing (see Dr. William E. Glenn, "A 1920×1080 60P System Compatible with a 1920× 1080 30I Format", SMPTE Journal, July/August 2002).

Figure 11:
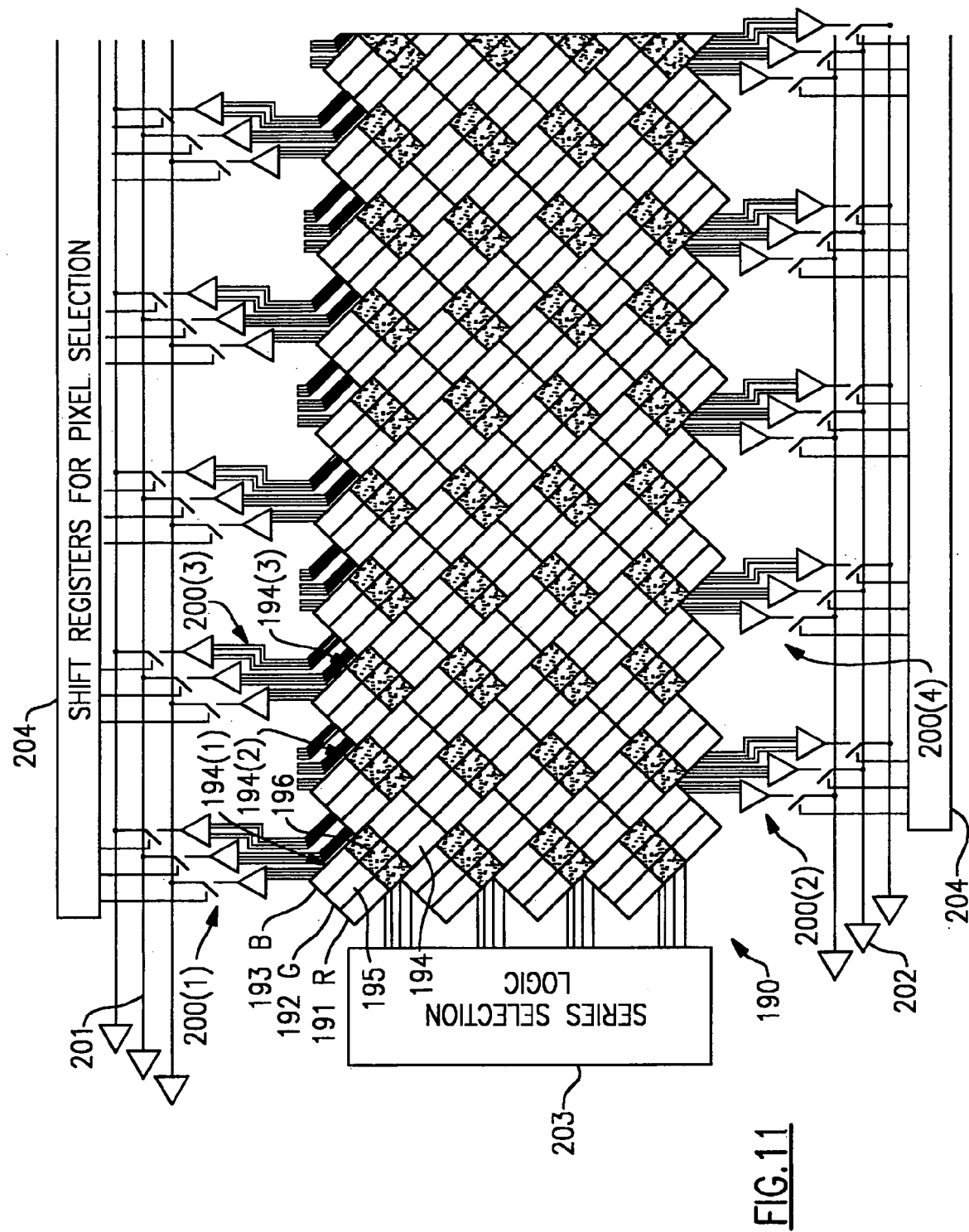
FIG. 11 is a diagram of pixel structure according to an embodiment of this invention.

FIG. 11 illustrates an actual imager pixel layout 190 with functional blocks added for purposes of illustration. Here, the layout 190 is configured with a diagonal color filter overlay. The diagonal color filters 191, 192, 193 are each laid out in a continuous strip that matches the pixel design below the filters. Here, each group 194(1) of pixels comprises a set 194 of red, green, and blue pixels on one side of a set of control transistors 196, and a similar set 195 of red, green, and blue pixels on the opposite side of the control transistors 196. The pixel regions are arranged on a diagonal, and on two opposite sides of the pixel control region. The pixel groups of the odd numbered columns define diagonal zones between them, and the even numbered pixel groups are situated within these diagonal zones. The entire group 194(1) is laid along a diagonal, and is offset in respect to an adjacent group 194(2) in the same row, at a pitch of ½ pixel. The group 194(1) is itself tilted at a diagonal, so that the groups of successive columns align with the groups of pixels on the next row down, so as to pixels of a given color lie along the same diagonal. The filters as placed minimize color cross talk, and have significantly better color discrimination as compared with imagers that employ matrix type of filters, such as Bayer method color filters. This improvement arises by minimizing the periphery per pixel that is available to allow cross talk. By laying the filters and pixels in a diagonal, each pixel has only two sides that abut against different color filters. In the Bayer system, by way of comparison, each pixel is adjacent a different color filter on all four sides. With the diagonal strip color filters as shown in FIG. 11, each pixel has only two sides adjacent a filter of a different color. Furthermore, the resolution benefits of color diagonal sampling are maintained as taught by Boemler et. al. Publ. Appln. 2002-0175270, and the Glenn article mentioned above.

In this arrangement, successive columns of pixel groups, i.e., 194(1), 194(2), 194(3), and on, have sets of red, green, and blue output lines 200(1), 200(2), 200(3), etc., that feed alternately to a first color video bus 201 disposed at one side and to a second color video bus 202 disposed at an opposite side of the imaging area. Series selection logic circuitry 203 is shown schematically, for turning on and gating the respective series of pixels, and shift register pixel selection circuitry 204 are shown schematically also, for selecting the respective pixels to be read out to the output busses. The imager with the pixel layout as shown here can be configured as a linear imager for scanning documents or for other scanning, or may be configured as a color or monochrome two-dimensional imager, with any number of pixels or pixel groups arranged into any desired numbers of row and columns.

While the invention has been described with reference to specific preferred embodiments, the invention is certainly not limited to those precise embodiments. Rather, many modifications and variations will become apparent to persons of skill in the art without departure from the scope and spirit of this invention, as defined in the appended claims.

We claim:

1. A system for scanning an image, comprising:
a plurality of CMOS imagers arranged end to end, each said CMOS imager including
two series of pixels situated alongside one another and wherein one of the series of pixels is offset from the other of the series of pixels;
two pairs of conductors extending along said series of pixels, with the pairs of conductors being associated with the respective series of pixels on said CMOS imager, and wherein
each said pixel includes a respective pixel amplifier FET having a source electrode and a drain electrode which are respectively coupled to the conductors of the associated pair of conductors and in parallel to all other pixel amplifier FETs of said series;
a plurality of jumper conductors connecting the conductors of each said pair of conductors of each said CMOS imager with the corresponding conductors of the remaining imagers;
a pair of output amplifiers each including an additional FET and a feedback path coupled to a respective pair of conductors of at least one of said CMOS imagers;

image control circuitry coupled to the series of pixels of said imagers; and image focusing means for forming an optical image onto said plurality of imagers.

2. The system as set forth in claim 1 wherein each said series of pixels includes a unitary differential amplifier having a plurality of first input transistors that are located at respective pixels within the series, and a second input transistor common to the pixels of that series and connected to the first input transistors so as to create a feedback loop.

3. The system as set forth in claim 1 wherein said image control circuitry comprises shutter controller means for controlling integration times of the pixels for the respective pixels in at least one of said series of pixels.

4. The system as set forth in claim 1 wherein said image control circuitry comprises resolution adjustment means for selectively skipping read out of one or more of the pixels in at least one of said series of pixels so as to permit reduction of resolution and increase of frame rate.

5. The system as set forth in claim 1 wherein the pixels of each said series of pixels are arranged in pairs or pixel regions arranged diagonally on two sides of a pixel control region such that the pairs of pixel regions each extend diagonally defining diagonal zones between successive pairs of pixel regions of that series, and wherein the pixels of the other series of pixels are situated within said diagonal zones.

6. The system as set forth in claim 5 wherein said pixel regions are divided into red, blue and green photosensitive areas, such that the red, blue, and green photosensitive areas are aligned diagonally with the corresponding photosensitive areas of the pixel region that is disposed opposite said pixel control regions, and wherein red, blue and green optical filters are disposed as ribbon filters extending diagonally across the respective pixels' photosensitive areas.

7. The system as set forth in claim 1, further comprising lens means for focusing an image of an object onto said plurality of CMOS imagers.

\* \* \* \* \*